219-121 SR
MTR09 XR 3,481,776

Dec. 2, 1969 K. E. MANCHESTER 3,481,776

ION IMPLANTATION TO FORM CONDUCTIVE CONTACT

Filed July 18, 1966

United States Patent Office 3,481,776

Patented Dec. 2, 1969

3,481,776

ION IMPLANTATION TO FORM CONDUCTIVE CONTACT

Kenneth E. Manchester, Williamstown, Mass., assignor to Sprague Electric Company, North Adams, Mass., a corporation of Massachusetts Filed July 18, 1966, Ser. No. 565,834

Int. Cl. B44d 1/18

U.S. Cl. 117—212 10 Claims

ABSTRACT OF THE DISCLOSURE

Conductive contacts are extended through an overlying protective coating of an electronic device without opening of the coating, by ion implantation in which ion penetration is varied through the coating thickness to form a conductive path from the device to the outer surface of the coating.

This invention relates to a method of forming contacts for electronic devices and more particularly to a method of forming metallic contacts through a protective insulating coating of the device and to electronic devices prepared thereby.

In the present state of the art, electronic devices such as planar type semiconductors are provided with a protective insulating coating over electrical regions. Connections are provided by means of metallic contacts which extend from the coating surface to the regions.

These contacts are generally fabricated by etching openings in the coating to expose portions of the active surface and thereafter depositing a metallic contact by such means as vapor deposition, plating and soldering etc. This procedure not only requires several steps such as masking, etching, cleaning and depositing but also exposes the surface of the high purity regions to undesirable contamination.

Depending upon the semiconductor construction, various other disadvantages are inherent in such contact construction. Thus, in devices provided by ion implanting techniques such as described in U.S. Patent No. 3,390,019 issued June 25, 1968 to Kenneth E. Manchester, the necessity of breaking the vacuum and removing the work piece from its aligning fixture, along with the subsequent exposure of the active regions, is both uneconomical and detrimental.

It is an object of this invention to provide a method of fabricating contacts for electronic devices.

It is another object of this invention to provide a method of forming contacts through a protective coating of an electronic device.

It is a further object of this invention to provide a method of fabricating contacts and interconnections without exposing active surfaces of the device to other than the contact material.

It is a still further object of this invention to provide a method of forming contacts to electrical regions by means of accelerated particles.

A still further object is to provide a method of manufacturing a complete semiconductor, including contacts extended through a protective coating, by means of electrically accelerated particles.

It is another object of this invention to provide a semiconductor device, including high ohmic contacts of low interface resistance and low region contamination, by means of accelerated particles.

These and other objects of the invention will be more apparent from the following description taken in conjunction with the drawing in which.

Briefly the method of providing contacts from the surface of a protective coating to the surface of an electronic device sealed within the coating includes the step of exposing a portion of the coating to electrically accelerated particles to form a conductive path therein.

In one embodiment, metallic ions are employed to penetrate the protective coating of an electrical unit to form by means of the deposited metal, a conductive path which extends from the external surface of the coating to the body, or regions of it.

In another embodiment, the coating is a metallic oxide which is exposed to protons which penetrate the coating and convert the oxide to metal in the exposed area; thereby providing a conductive path from the surface of the coating to the region beneath it.

An electronic device provided in accordance with the invention comprises a semiconductor body having conductive contacts formed through a protective coating of the body by electrically accelerated particles.

Figure 1:
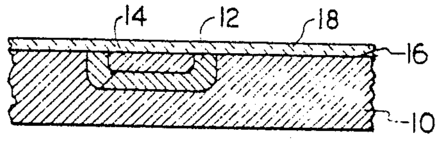
Fig. 1 Prior Art
FIGURE 1 is a view in section of a semiconductor device showing its active regions and a protective surface coating.

Referring now to the figures and to FIGURE 1 in particular wherein a semiconductor body 10 is shown having impurity regions 12 and 14 which are provided within substrate 10 at one surface 16, beneath a protective coating 18. This structure is provided by any conventional means such as by planar diffusion techniques or ion implantation, etc.

Accordingly, substrate 10 may be formed from a silicon or any suitable semiconductive material such as the intermetallics, SiC and diamond or the like which is doped to a specific resistivity value of one conductivity type. Thereafter an impurity region 12 of the other conductivity type is formed within substrate 10 by, for example, diffusion of a suitable impurity and a further region 14 of the one conductive type is then formed within region 12.

In the planar process described, the regions are formed so that the junction between regions at surface 16 is beneath coating 18. Various protective coatings such as silicon oxide, silicon nitride and aluminum oxide or the like are suitable. Such coatings may be provided by any of the methods known in the art such as oxidation, sputtering, evaporation or decomposition techniques. The device is then completed by providing an electrical connection from the external surface 26 of the protective coating to the active elements.

Figure 2:
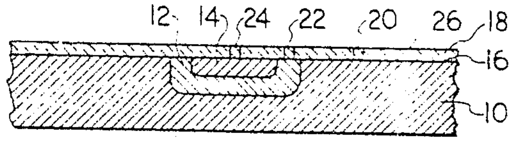
FIGURE 2 is a view in section of the device of FIGURE 1 showing conductive contacts extended through the coating to the active regions.

In FIGURE 2, contacts 20, 22 and 24 are shown within coating 18, extending from its external surface 26 to surface 16 where each provide a low resistance ohmic connection to appropriate portions of the device.

In one embodiment, contacts 20, 22 and 24 are formed by exposing appropriate portions of surface 26 to metallic particles or metallic ions, such as an ion beam. Sufficient beam energy or particle energy is provided so that the ions penetrate through coating 18, and to a very shallow depth in the semiconductor phase at surface 16; thereby providing a degenerate region of ohmic contact at the latter surface.

Advantageously, contacts may be formed by this means in various protective coatings since the metallic path is deposited from the particles or ions employed in the beam. Various metallic ions may be employed, although aluminum ions are preferred since these provide a degenerate region for good ohmic contact.

By way of example, a contact was made through a silicon oxide coating to a P-type region of a semiconductor diode by impinging a 50 μamp aluminum ion beam on the oxide. The energy of the beam was varied between 60 kev. and 10 kev. to bring the conductive path to the surface since experimental data has indicated that the projected range in angstroms, of alminum ions in silicon oxide, is equal to 40.2 E; where E is in kiloelectron volts. A large area ion beam was used in cooperation with a mask which permitted exposure of only the desired portions of the surface. It should be understood, however, that a similar contact could also be provided by a focused beam.

In a further embodiment, a 10–30 μamp proton or hydrogen ion beam accelerated from 10–15 kev. is employed to penetrate a 1000 angstrom thick metallic oxide coating so as to convert the oxide to form a conductive path from its reduced metal. This process, although restricted to use with metallic coatings is advantageous, since many of the metallic oxides such as aluminum and titanium oxide, although preferred as insulating coatings were limited in use in the prior art due to their resistance to etching. The vector range in angstroms of hydrogen ions or protons in aluminum oxide has been calculated to be equal to 1520 $E^{1/2}$, where E is in kiloelectron volts. Experimentally, the projected depth or range was found to be approximately 0.7 of the vector range.

Advantageously, the contacts may be formed by either method without opening the protective coating, thereby avoiding surface contamination. Furthermore, a complete semiconductor device including contacts may be provided by ion beam techniques without removing the work piece from the chamber.

Figure 3:
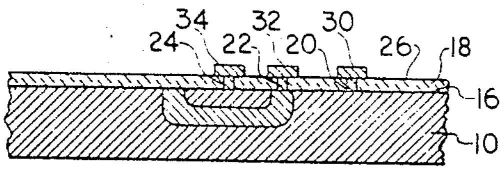
FIGURE 3 is a view in section of the device of FIGURE 2 illustrating completed contacts.

The device is completed by providing conductive strips or lands 30, 32 and 34 in connection to the conductive paths 20, 22 and 24 as shown in FIGURE 3. These may be deposited by a metallic ion beam or by any conventional means such as soldering, welding, plating and vacuum deposition or the like.

The lands or interconnections may also be provided within coating 18 at surface 26 by either of the methods described for the conductive paths 20, 22 and 24. Thus by control of the beam voltages a shallow penetration of surface 26 may be provided such that the conversion or deposit does not extend to surface 16. In this maner, the conductive path may be extended from he electrical region through the coating and then along, or within, the coating to common terminals or the like.

As indicated, many different embodiments are possible. For example, the process described could be employed to contact either active or passive devices sealed within a protective coating and may, of course, be employed for other than semiconductive devices. It is therefore to be understood that the invention is to be limited only by the scope of the appended claims.

What is claimed is:

1. A method of forming a conductive contact extending from the outer surface of an insulative coating to an electronic device sealed within the coating without the opening of said coating, said method comprising the steps of exposing a selected portion of said coating to electrically accelerated ion particles to form conductive material therein, and varying the acceleration of said ion particles so as to vary their penetration and the resulting conductive material formation throughout the depth of said coating to provide a substantially ohmic contact to said device and a conductive path extending therefrom to the outer surface of said coating.

2. A method as claimed in claim 1 in which said coating is a metallic oxide and said ion particles are protons, said protons penetrating said coating and converting said oxide to the metallic element thereof to form said conductive material therein, and said acceleration is varied to vary said penetration throughout the depth of said coating to form said conductive path and said ohmic contact to said device.

3. A method as claimed in claim 2 in which said oxide is aluminum oxide.

4. A method as claimed in claim 2 in which said oxide is titanium oxide.

5. A method as claimed in claim 1 in which said ion particles are metallic particles, and said acceleration is varied such that said particles are implanted throughout the depth of said selected portion of said coating to provide a conductive path from the surface of said device to the outer surface of said coating.

6. A method as claimed in claim 5 in which said device is a semiconductive device, and said metallic ion particles are also accelerated to penetrate a shallow depth in the surface of the device for providing a degenerate region of substantially ohmic contact at said surface.

7. A method as claimed in claim 6 in which said metallic particles are aluminum.

8. An electronic device comprising a body having an insulative coating on a surface thereof and at least one conductive contact extended through said coating to said body and an electrical region thereof, said contact formed by exposure of a selected portion of said coating throughout the depth thereof to electrically accelerated ion particles.

9. A device as claimed in claim 8 in which said contact is provided by metallic ion particles deposited throughout the depth of said selected portion of said coating by an ion beam.

10. A device as claimed in claim 8 in which said coating is a metallic oxide and said contact is formed of the metallic element of said oxide by exposure to proton particles throughout the depth of said selected portion of coating.

References Cited

UNITED STATES PATENTS

| | | | |
|---|---|---|---|
| 3,056,881 | 10/1962 | Schwarz | 219—50 |
| 3,234,044 | 2/1966 | Andes et al. | 117—212 |
| 3,294,583 | 12/1966 | Fedocos-Fedotowsky | 117—93.3 X |
| 3,232,198 | 6/1967 | Shortes | 117—93.3 |

ALFRED L. LEAVITT, Primary Examiner

ALAN GRIMALDI, Assistant Examiner

U.S. Cl. X.R.

29—576; 117—93.3; 148—1.5; 317—234

PO-1050
(5/69)

UNITED STATES PATENT OFFICE
CERTIFICATE OF CORRECTION

Patent No. 3,481,776 Dated December 2, 1969

Inventor(s) Kenneth E. Manchester

It is certified that error appears in the above-identified patent and that said Letters Patent are hereby corrected as shown below:

Column 2, line 34, after "from" omit -- a --
Column 3, line 13, change "15" to -- 50 --
Column 3, line 44, change "maner" to -- manner --
Column 3, line 45, change "he" to -- the --
Column 4, line 53, change "Fedocos" to -- Fedows --
Column 4, line 55, change "3,232,198" to -- 3,323,198 -

SIGNED AND
SEALED
APR 28 1970

(SEAL)
Attest:

Edward M. Fletcher, Jr.
Attesting Officer

WILLIAM E. SCHUYLER, JR.
Commissioner of Patents